United States Patent [19]

Okada

[11] Patent Number: 5,020,067
[45] Date of Patent: May 28, 1991

[54] SEMICONDUCTOR LASER DEVICE

[75] Inventor: Masato Okada, Itami, Japan

[73] Assignee: Mitsubishi Denki Kabushiki Kaisha, Japan

[21] Appl. No.: 472,285

[22] Filed: Jan. 30, 1990

[30] Foreign Application Priority Data

Feb. 1, 1989 [JP] Japan ............................... 1-24453

[51] Int. Cl.$^5$ .......................................... H01S 3/19
[52] U.S. Cl. ................................. 372/46; 372/45
[58] Field of Search ............................. 372/45, 46

[56] References Cited

U.S. PATENT DOCUMENTS

| | | | |
|---|---|---|---|
| 4,371,966 | 2/1983 | Scifres et al. | 372/45 |
| 4,849,372 | 7/1989 | Takemoto | 437/129 |
| 4,916,709 | 4/1990 | Ota et al. | 372/46 |
| 4,961,197 | 10/1990 | Tanaka et al. | 372/45 |
| 4,964,135 | 10/1990 | Mitsui et al. | 372/46 |

FOREIGN PATENT DOCUMENTS 60-101989  6/1985  Japan .

OTHER PUBLICATIONS

Mawst et al., "Complementary Self-Aligned... Deposition", Electronics Letters, vol. 21, No. 20, Sep. 1985, pp. 903-905.

*Primary Examiner*—Georgia Epps
*Attorney, Agent, or Firm*—Leydig, Voit & Mayer

[57] ABSTRACT

A semiconductor laser device includes an n type $Al_xGa_{1-x}As$ first cladding layer disposed on an n type GaAs substrate, an n type $Al_yGa_{1-y}As$ ($x>y$) light guide layer disposed on the first cladding layer, an $Al_zGa_{1-z}As$ ($y>z$) active layer disposed on the light guide layer, a p type $Al_pGa_{1-p}As$ second cladding layer disposed on the active layer and including a ridge except in the neighborhood of at least of the cavity facets, an n type GaAs current blocking layer disposed on the second cladding layer but not on top of the ridge, and a p type GaAs contact layer disposed on the current blocking layer and on top of the ridge portion.

9 Claims, 9 Drawing Sheets

SEMICONDUCTOR LASER DEVICE

FIELD OF THE INVENTION

The present invention relates to a semiconductor laser device and a production method therefor and, more particularly, to a laser producing a high output power.

BACKGROUND OF THE INVENTION

Figure 7A:
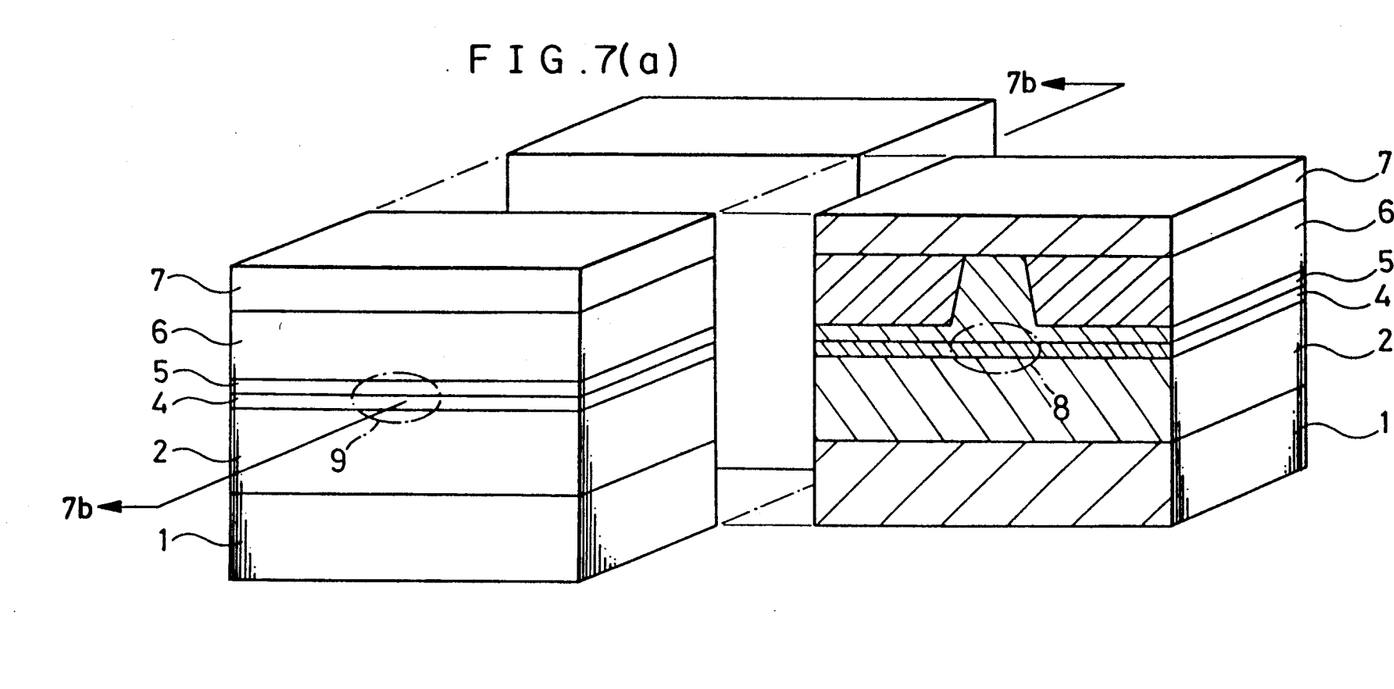
FIGS. 7(a) and 7(b) are sectional views of a known semiconductor laser device.
Figure 7B:
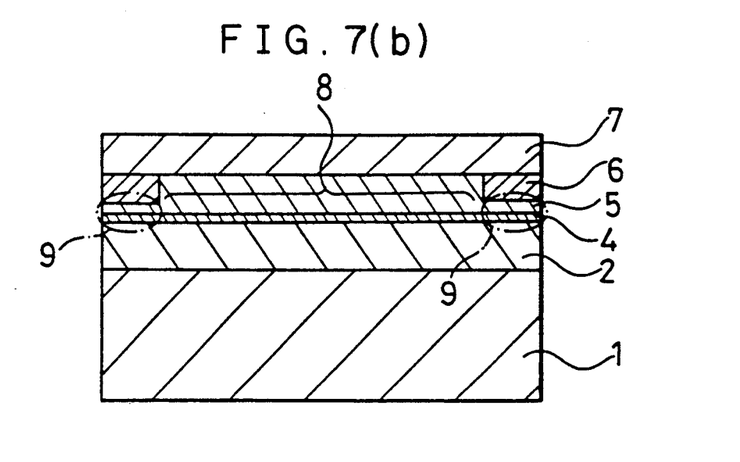

FIGS. 7(a) and 7(b) show a known semiconductor laser device of a loss guide type having a current injection region in the neighborhood of the laser facet. FIG. 7(a) shows transverse cross-sectional view the neighborhood of the laser facet and the inside of the cavity. FIG. 7(b) shows a longitudinal cross-sectional view of the laser and particularly the oscillation region 8.

In FIGS. 7(a) and 7(b), reference numeral 1 designates an n type GaAs substrate. A first cladding layer 2 comprising n type $Al_{0.5}Ga_{0.5}As$ is disposed on the GaAs substrate 1. A p type $Al_{0.15}Ga_{0.85}As$ active layer 4 is disposed on the first cladding layer 2. A p type second cladding layer 5 comprising p type $Al_{0.5}Ga_{0.5}As$ having a stripe shaped ridge portion except in the neighborhood of the cavity facets is disposed on the active layer 4. An n type GaAs current blocking layer 6 is disposed on the second cladding layer 5. A p type GaAs contact layer 7 is disposed on the n type GaAs current blocking layer 6. Reference numeral 8 designates a laser oscillation region and reference numeral 9 designates a current non-injection region.

The device will operate as follows.

In the laser oscillation region 8, minority carriers in a concentration of of about $10^{18}$ per $cm^3$ are injected into the active layer 4, producing a population inversion and a large portion of the injected carriers are converted into photons. In the current non-injection region 9, because the quantity of minority carriers injected is small, excitation minority carriers by the laser light increases. The density of the excited carriers is significantly smaller than the density of injected carriers. By this effect, the non-radiative recombination of electron hole pairs via the surface energy levels at the facet of the active layer are largely reduced relative to a case where there is no current non-injection region 9. Therefore, the light output level at which the destruction of cavity facet due to light increases, that is, the so-called COD level is increased.

Figure 8:
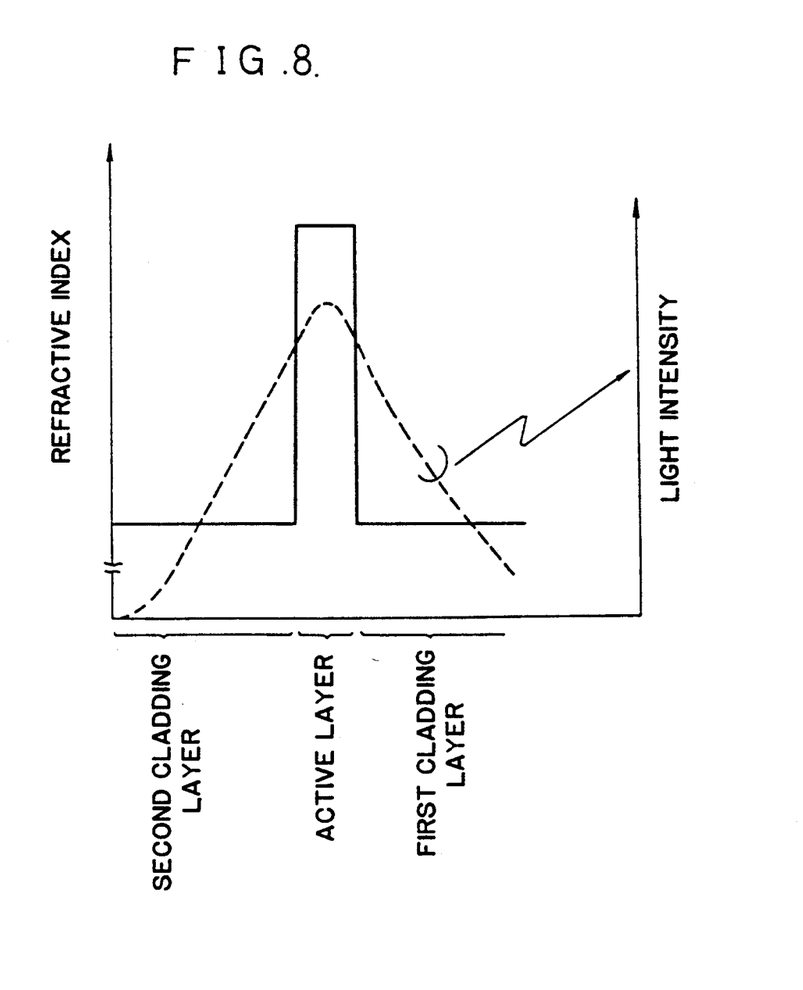
FIG. 8 is a diagram of the light intensity distribution of the semiconductor laser device of FIGS. 7(a) and 7.

In the semiconductor laser device of FIGS. 7(a) and 7(b) however, in order to confine the light in the transverse direction through reflection by the blocking layer into the cavity, the thickness of the second cladding layer 5, except at the stripe ridge, is about 0.3 micron. Therefore, the thickness of the second cladding layer 5 in the neighborhood of the resonator facet is also about 0.3 micron. Because the current blocking layer 6 is GaAs, the laser light is absorbed, and the light absorption coefficient is extremely high. Furthermore, as shown in FIG. 8, the light emission region is broadened inside the laser to the same extent as the second cladding layer including the active layer as its center. In the neighborhood of the cavity, however, because there exists a current blocking layer having a high light absorption coefficient quite close to the active layer, the light intensity does achieve the distribution shown in FIG. 8, but becomes unstable. Accordingly, no optical mode can be obtained. Even if an optical mode is established, it is not at the resonator facet. Thus, it is not possible to obtain a stable optical characteristic.

Furthermore, when the light output is to be increased, the absorption of light by the active layer may melt the active layer. Thus, there is a limit to the increase in the of COD level that can be achieved even if a cavity facet non-injection structure is employed.

SUMMARY OF THE INVENTION

It is an object of the present invention to provide a semiconductor laser device having stable optical characteristics, high reliability, and a greatly increased COD level to a great extent.

It is another object of the present invention to provide a method of producing such a semiconductor laser device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a semiconductor laser device includes a first cladding layer comprising n type $Al_xGa_{1-x}As$ disposed on a semi-insulating n type GaAs substrate, a light guide layer comprising n type $Al_yGa_{1-y}As$ (x>y) disposed on the first cladding layer, an n type or p type or intrinsic $Al_zGa_{1-z}As$ (y>z) active layer, a second cladding layer comprising p type $Al_pGa_{1-p}As$ (p>z) having a stripe shaped ridge except in the neighborhoods of the facets, an n type current blocking layer burying the second cladding layer except for the ridge, and a p type GaAs contact layer disposed on the current blocking layer and on top of the ridge. Therefore, the light intensity distribution inside the cavity is shifted toward the light guide layer side, and the light emission region is spaced from the current blocking layer, whereby the mode of light oscillation at the facet is stabilized.

According to another aspect of the present invention, a semiconductor laser device includes a first cladding layer comprising an n type $Al_xGa_{1-x}As$ disposed on a semi-insulating n type GaAs substrate, a light guide layer comprising n type $Al_yGa_{1-y}As$ (x>y) disposed on the first cladding layer, an n type or p type or intrinsic $Al_pGa_{1-p}As$-$Al_qGa_{1-q}As$ (y>q>p) multi-quantum well active layer, a second cladding layer comprising p type $Al_zGa_{1-z}As$ (z>q) having a stripe shaped ridge except in the neighborhood of at least one of the facets, a p type GaAs buffer layer disposed on the second cladding layer, except on the ridge, and having a higher depart concentration than the second cladding layer, an n type current blocking layer burying the buffer layer except at the ridge, and a p type GaAs contact layer disposed on the current blocking layer and on top of the ridge, and the MQW active layer is disordered by the diffusion of p type dopants from the p type GaAs buffer layer except opposite the ridge. Therefore, the coincidence between the pn junction surface and the regrowth interface can be avoided and the COD level can be significantly increased. Thus, high power output operation can be achieved.

According to a further aspect of the present invention, a production method of a semiconductor device includes successively growing a first cladding layer comprising n type Al$_x$Ga$_{1-x}$As, a light guide layer comprising n type Al$_y$Ga$_{1-y}$As (x>y), an n type or p type or instrinsic Al$_z$Ga$_{1-z}$As (y>z) active layer, a second cladding layer comprising p type Al$_p$Ga$_{1-p}$As (p>z), and a p type GaAs cap layer on an n type GaAs substrate in a first epitaxial growth process, etching portions of the p type cap layer and the p type second cladding layer to leave a stripe except in the neighborhood of at least one of the facets, and successively growing a p type GaAs buffer layer containing a higher concentration of p type dopants than the p type AlGaAs second cladding layer other than on the top of the stripe ridge and the n type GaAs current blocking layer in a second epitaxial growth process, and covering the top of the stripe shaped p type cap layer and the n type current blocking layer with a p type GaAs contact layer in a third epitaxial growth process, and in the second and, third epitaxial growth processes, by auto-doping of the p type dopants from the p type buffer layer, disordering the MQW layer except directly below the stripe shaped ridge. Therefore, a semiconductor laser device having a current non-injection region and a window structure at the facet for high power output operation can be easily produced.

DETAILED DESCRIPTION OF THE PREFERRED EMBODIMENTS

An embodiment of the present invention will be described in detail with reference to the drawings.

Figure 1A:
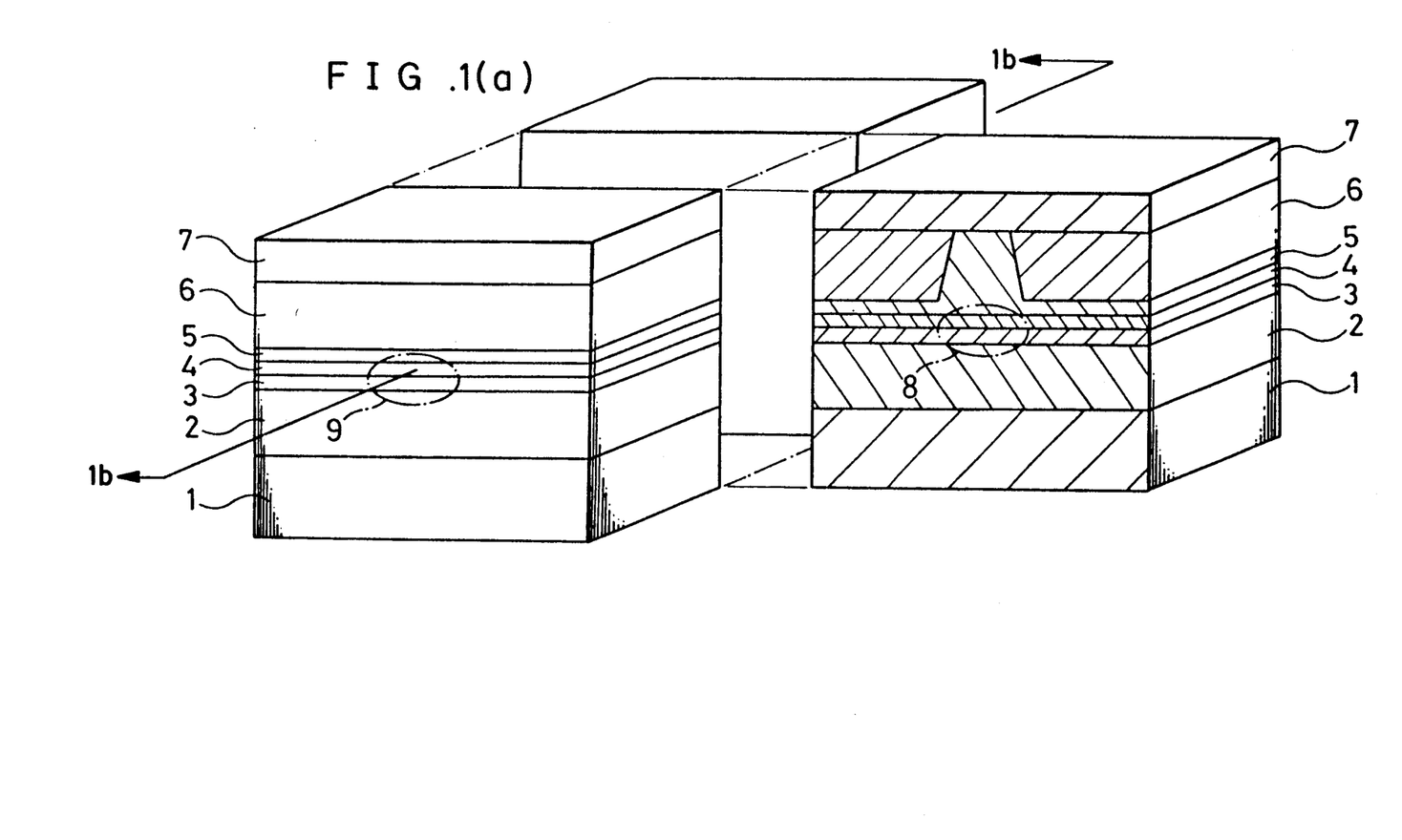
FIGS. 1(a) and 1(b) are sectional views of a semiconductor laser device according to a first embodiment of the present invention.
Figure 1B:
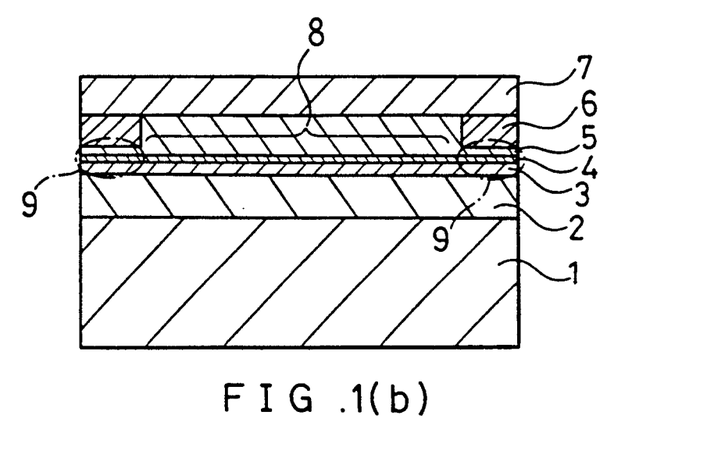

FIGS. 1(a) and 1(b) show a semiconductor laser device according to a first embodiment of the present invention. FIG. 1(a) includes transverse cross-sectional views showing the neighborhood of facet and the inside of the cavity, and FIG. 1(b) is a longitudinal particularly showing cross-section the laser oscillation region 8. In those figures reference numeral 1 designates an n type GaAs substrate. A first cladding layer 2 comprising n type Al$_{0.5}$Ga$_{0.5}$As is disposed on the substrate 1. An n type AlGaAs light guide layer 3 is disposed on the first cladding layer 2. A p type Al$_{0.15}$Ga$_{0.85}$As active layer 4 is disposed on the light guide layer 3. A second cladding layer 5 comprising p type Al$_{0.5}$Ga$_{0.5}$As having and having a stripe shaped ridge, except in the neighborhoods of the facets, is disposed on the active layer 4. An n type GaAs blocking layer 6 buries the second cladding layer 5 except at the top surface of which is opposite the substrate 1. A p type GaAs contact layer 7 is disposed on the n type GaAs current blocking layer 6 and on the top surface of the ridge. Reference numeral 8 designates a laser oscillation region and reference numeral 9 designates a current non-injection region.

The device will operate as follows.

Figure 2:
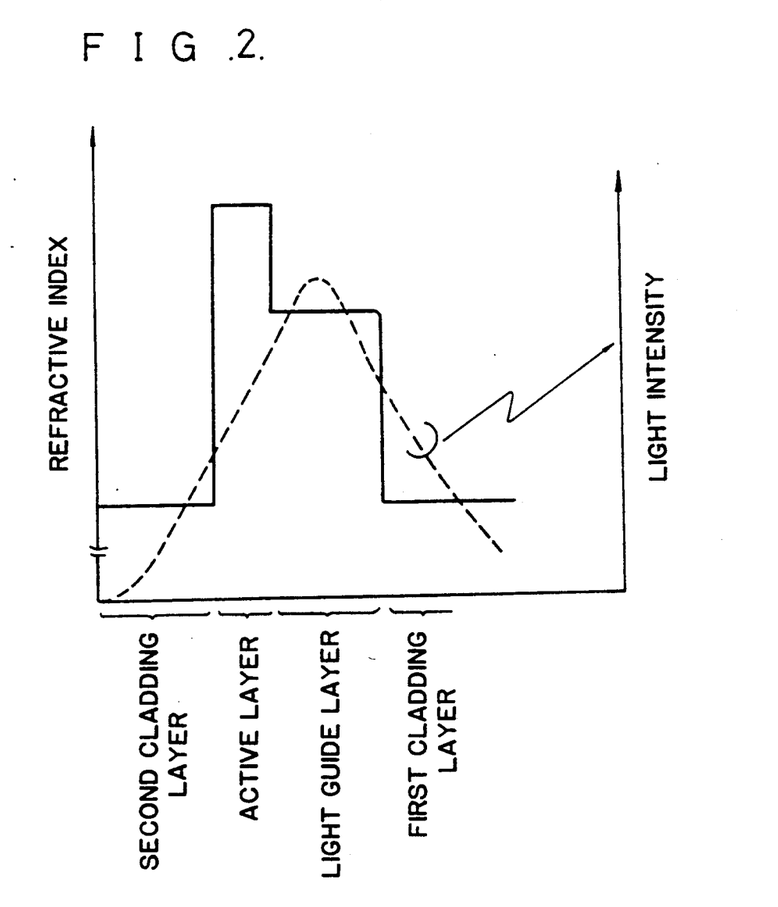
FIG. 2 is a diagram of the light intensity distribution in the neighborhood of the facet of the device of FIG. 1.

The mechanism of laser oscillation is the same as in the known device. In order to stabilize the mode of light oscillation in the neighborhood of the facets, which has been a problem, a light guide layer 3 is disposed between the active layer 4 and the first cladding layer 2. This light guide layer 3 has a refractive index intermediate that of the active layer 4 and the second cladding layer 5. Therefore, the light distribution is shifted toward the light guide layer 3 as shown in FIG. 2 (refer to page 172 of "Light Communication Element Optics", by Yonezu). Accordingly, the light emission region at the facet is seperated from the current blocking layer 6 and the mode of laser oscillation is stabilized.

The production process of a variation of the embodiment of FIGS. 1(a) and 1(b) will be described with reference to FIGS. 5(a) to 5(g).

Figure 5A:
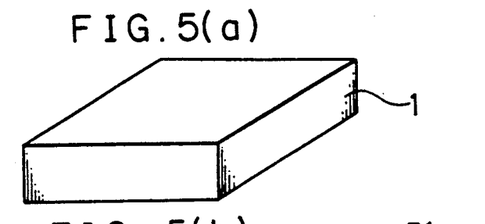
FIGS. 5(a) to 5(g) are schematic perspective views for explaining production of the embodiment of FIG. 1.
Figures 5B, 5C:
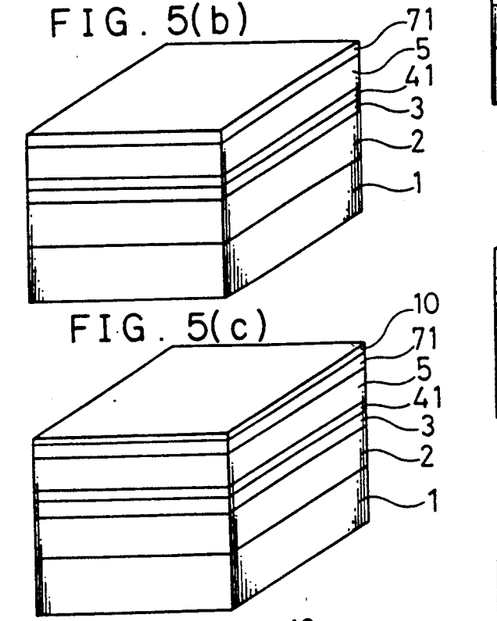
Figure 5D:
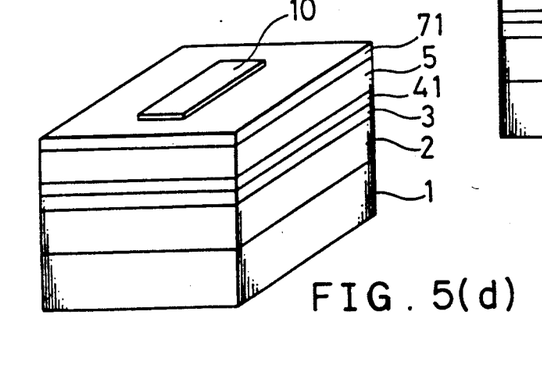
Figure 5E:
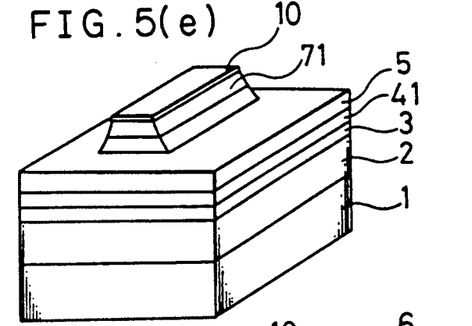
Figure 5F:
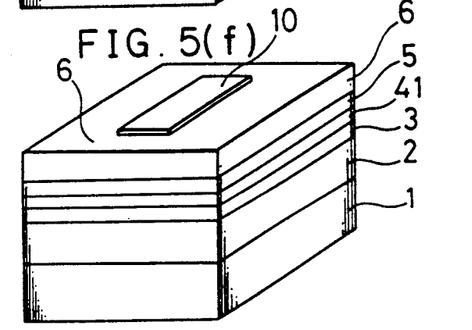
Figure 5G:
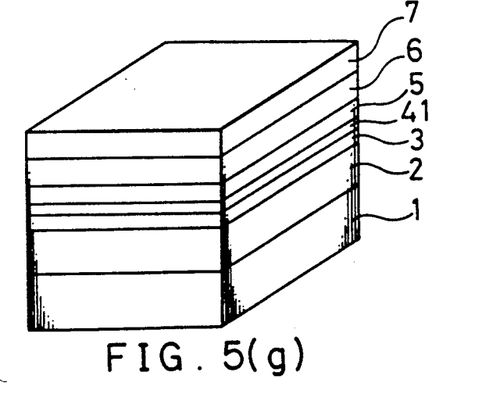

In a first expitaxial growth process, an n type Al$_x$Ga$_{1-x}$As first cladding layer 2, an Al$_y$Ga$_{1-y}$As (x>y) light guide layer 3, a p type Al$_p$Ga$_{1-p}$As-Al$_q$Ga$_{1-q}$As (y>q>p) multi-quantum well layer 41, a p type Al$_x$Ga$_{1-x}$As second cladding layer 5, and a p type GaAs cap layer 71 are epitaxially grown on an n type GaAs substrate 1 shown in FIGS. 5(a) and 5(b). An amorphous film 10 is disposed on the p type GaAs cap layer 71 as shown in FIG. 5(c). Next, the amorphous film 10 is etched to a stripe shape, the short ends of which are spaced from the facets as shown in FIG. 5(d). Portions of the p type GaAs cap layer 71 and the p type Al$_x$Ga$_{1-x}$As second cladding layer 5 are etched to form a stripe shaped ridge which does not extend to the neighborhoods of the cavity facets using the stripe shaped amorphous film 10 as an etching mask as shown in FIG. 5(e). In a second epitaxial growth process, an n type GaAs current blocking layer 6 is grown on layer 5 byt not on the top surface of the ridge using the amorphous film 10 as a selective growth mask as shown in FIG. 5(f). After removing the amorphous film 10, in a third epitaxial growth, a p type GaAs contact layer 7 grown on the top surface of the ridge and on the n type GaAs current blocking layer 6 as shown in FIG. 5(g). Thereafter, a p side electrode and an n side electrode are deposited on the contact layer 7 and the substrate 1, respectively, thereby completing a laser device.

In the embodiments described with respect to FIGS. 1(a) and 5(g), the current blocking layer 6 is disposed directly on the second cladding layer 5, and therefore, the interface between the second cladding layer 5 and the current blocking layer 6 is a regrowth interface. Furthermore, the second cladding layer 5 is p type, and the current blocking layer is n type. The interface between the second cladding layer 5 and the current blocking layer 6 is a regrowth interface as well as a pn junction. This results in difficulty in improving reliability.

Figure 3A:
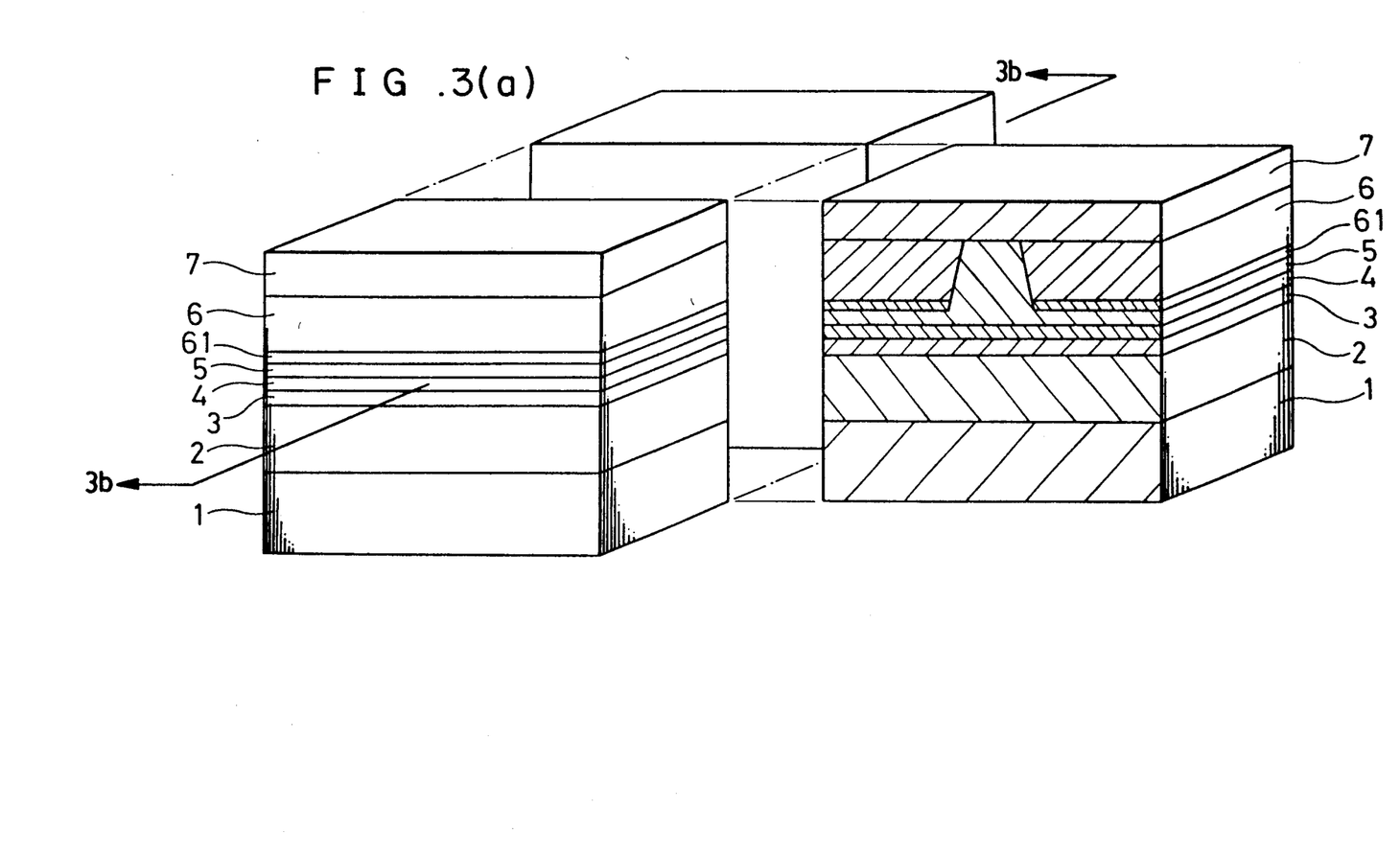
FIGS. 3(a) and 3(b) are sectional views of a semiconductor laser device according to a second embodiment of the present invention.
Figure 3B:
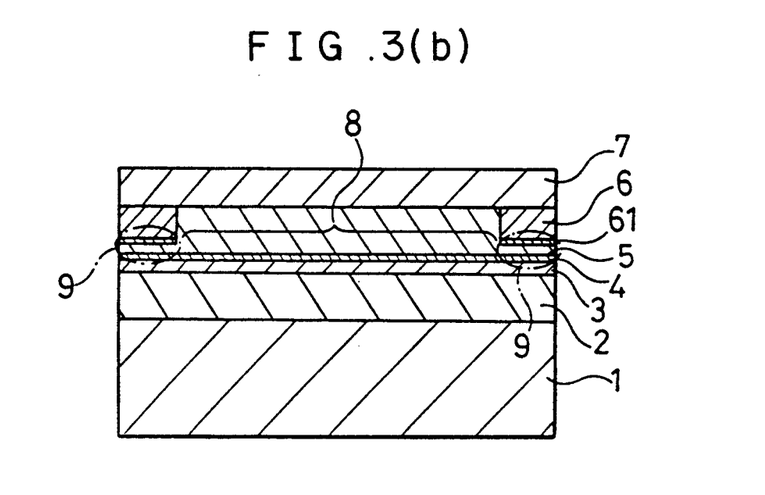

FIGS. 3(a) and 3(b) show a semiconductor laser device according to a second embodiment of the present invention which has solved the above-described problems. FIG. 3(a) shows transverse cross-sectional views in the neighborhood of the resonator facet and inside the device of this embodiment and FIG. 3(b) is a longitudinal cross-sectional view particularly showing the laser oscillation region 8. In these figures, same reference numerals designate the same or corresponding elements as those in FIGS 1(a) and 1(b) and reference numeral 61 designates a p type GaAs buffer layer.

In this second embodiment, a p type GaAs buffer layer 61 is disposed between the second cladding layer 5 and the current blocking layer 6. Therefore, the coincidence of the regrowth interface and the pn junction is avoided, thereby enhancing reliability.

In increasing the light output in the semiconductor laser device, however, the active layer may be melted by absorbed laser light, limiting the improvement of the COD level even when a non-injection facet structure is adopted.

Figure 4A:
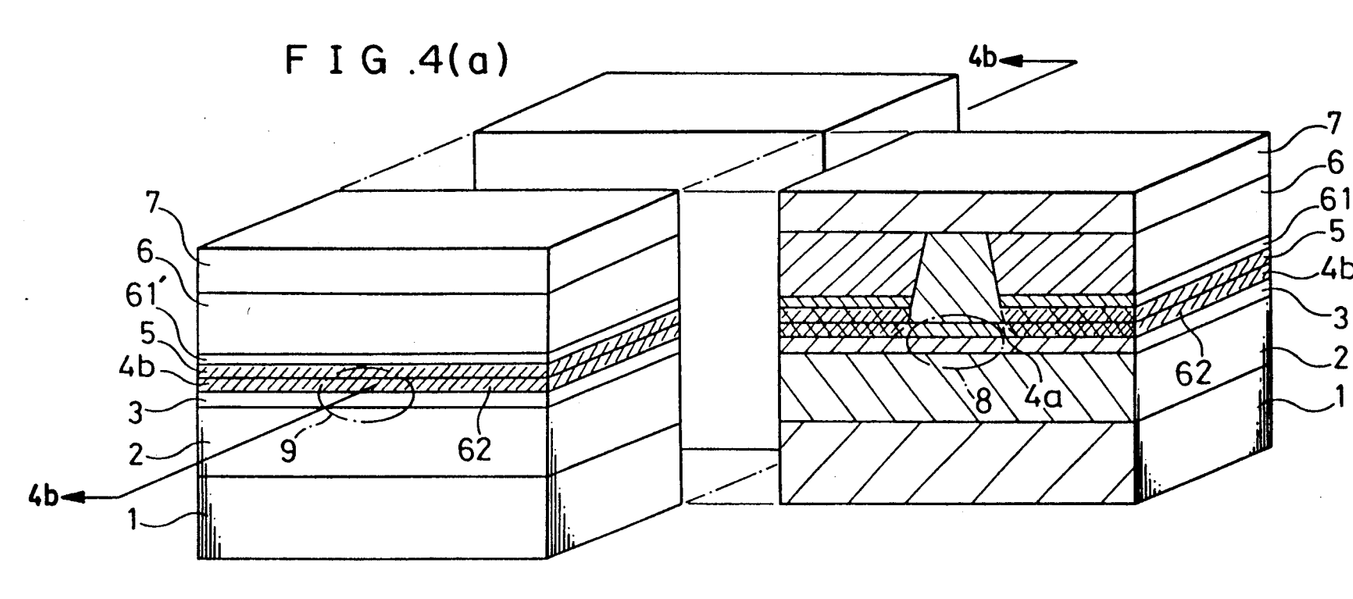
FIGS. 4(a) and 4(b) are sectional views of a semiconductor laser device according to a third embodiment of the present invention.
Figure 4B:
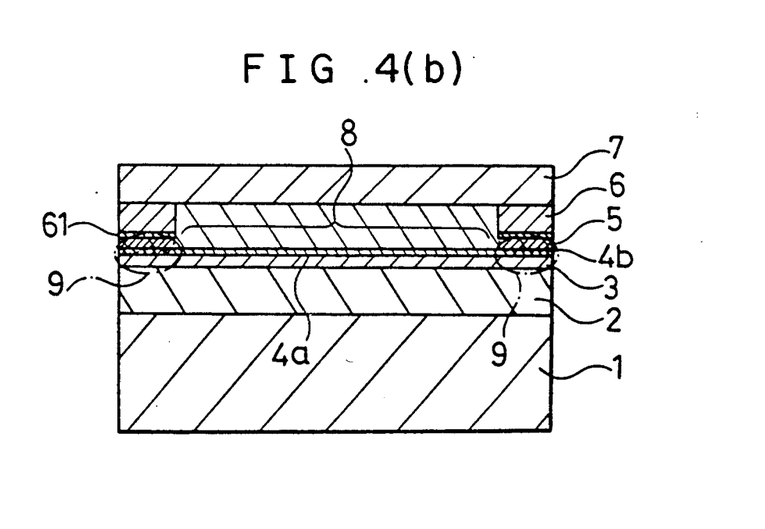

FIGS. 4(a) and 4(b) show a semiconductor laser device having a facet window structure according to a third embodiment of the present invention, which has solved the above-described problems. FIG. 4(a) shows transverse cross-sectional views in the neighborhood of the facet and inside of the cavity and FIG. 4(b) shows a longitudinal cross-sectional view, particularly of the laser oscillation region 8. In these figures, reference numeral 4a designates an active layer comprising an AlGaAs series multi-quantum well layer, and reference numeral 61' designates a p type GaAs buffer layer having a larger dopant concentration than the p type $Al_{0.5}Ga_{0.5}As$ second cladding layer 5. Reference numeral 62 designates a p type dopant diffusion region produced by auto-doping of p type dopants from the p type GaAs buffer layer 61'. Reference numeral 4b designates an active layer in which the multi-quantum well layer is disordered by p type impurities diffused from the p type GaAs buffer layer 61'.

The device will operate as follows.

The mechanism of laser oscillation is the same as in the above-described embodiments. In this embodiment, the mode of laser light oscillations in the neighborhood of the facet is stabilized by the light guide layer 3. Herein, while the photon energy of laser light is determined by the energy band gap of the MQW active layer 4a inside the cavity, the energy band gap of the disordered active layer 4b in the neighborhood of the facet is increased. Therefore, the laser light is not absorbed by the disordered active layer 4b in the neighborhood of the facet. Thus, a so-called window effect is obtained.

Figures 6A, 6B, 6C, 6D, 6E, 6F, 6G:
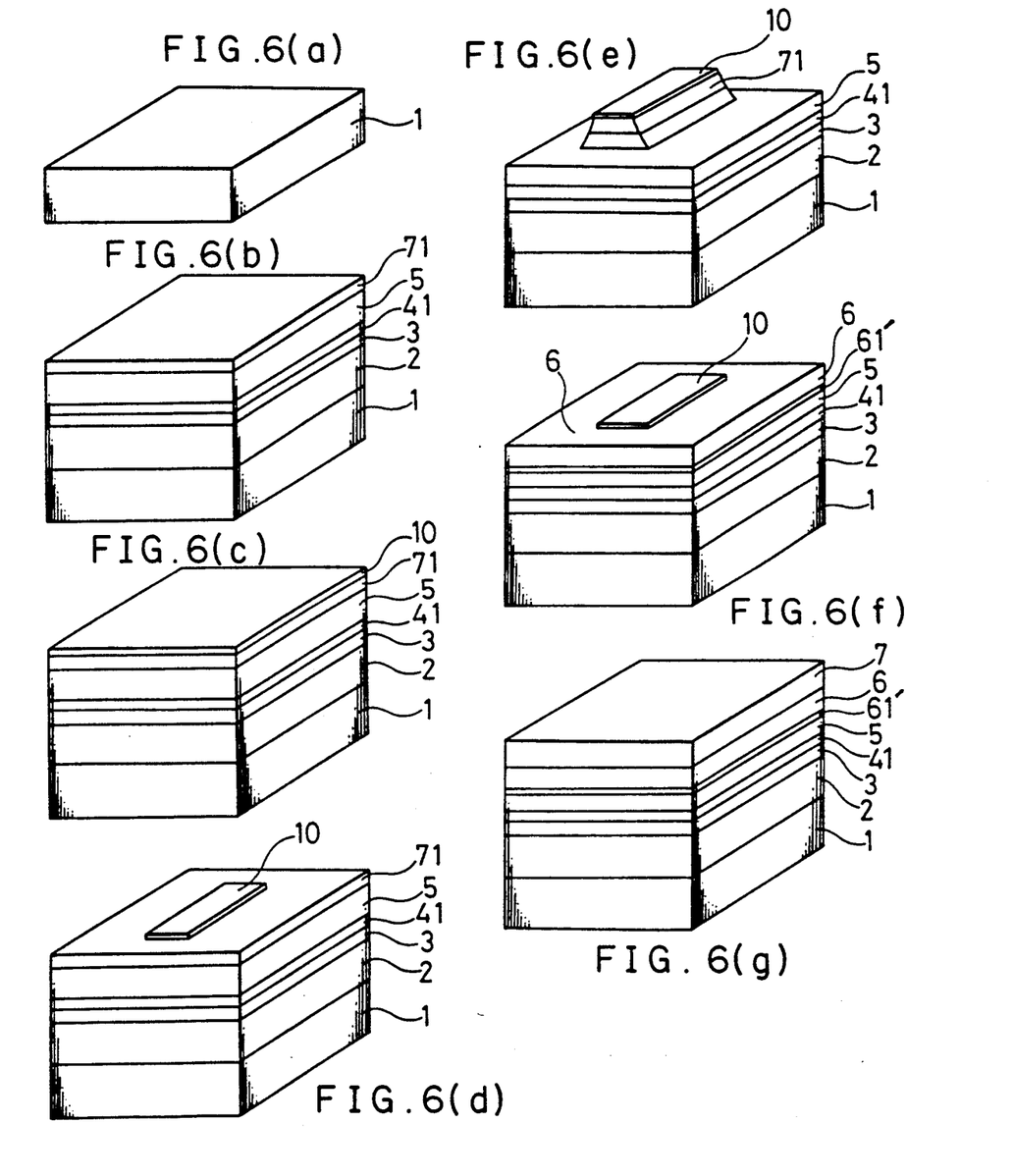
FIGS. 6(a) to 6(g) are schematic perspective views for explaining production of the embodiment of FIG. 4.

The production process of a described of a variation of the embodiment of FIG. 40 with reference to FIG. 6(a) to 6(g). In a first epitaxial growth process, an n type $Al_xGa_{1-x}As$ first cladding layer 2, an $Al_yGa_{1-y}As$ (x>y) light guide layer 3, a p type $Al_pGa_{1-p}As$-$Al_qGa_{1-q}As$ multi-quantum well layer 41, a p type $Al_xGa_{1-x}As$ second cladding layer 5 and the p type GaAs cap layer 71 are epitaxially grown on the n type GaAs substrate 1 as shown in FIGS. 6(a) and 6(b). Thereafter, an amorphous film 10 is deposited on the p type GaAs cap layer 71 as shown in FIG. 6(c). Next, the amorphous film 10 is etched to a stripe shape having short ends are spaced from the facets as shown in FIG. 6(d). A portion of the p type GaAs cap layer 71 and the p type $Al_xGa_{1-x}As$ second cladding layer are formed into a stripe ridge which does not extend to the neighborhood of the facets by etching using the stripeshaped amorphous film 10 as an etching mask as shown in FIG. 6(e). In a second epitaxial growth process, a p type GaAs buffer layer 61' containing p type dopants in a higher concentration than the p type $Al_xGa_{1-x}As$ second cladding layer 5 and an n type GaAs current blocking layer 6 are successively grown on the second cladding layer 5 except on the top surface of the ridge using the amorphous film 10 as a growth selective mask as shown in FIG. 6(f). After removing the amorphous film 10, in a third epitaxial growth, a p type GaAs contact layer 7 is grown on the top surface of the ridge and on the n type GaAs current blocking layer 6 as shown in FIG. 6(g). During the second and third epitaxial growth processes, auto-doping of p type impurities arises from the buffer layer 61'. Then, because the stripe-shaped ridge, except in the neighborhood of the facet, includes the second cladding layer 5 and the cap layer 71, the distance between the active layer under the ridge and the buffer layer 61' and the distance between the active layer elsewhere and the buffer layer 61' are different. The multi-quantum well layer 4b except directly below the stripe-shaped convex portion is disordered by the diffusion of the p type dopant from the buffer layer 61' as shown in FIG. 4(a). Thereafter, a p side electrode and an n side electrode are produced on the contact layer 7 and the substrate 1, respectively, thereby completing the laser.

In the production method for the third embodiment, the distance from the active layer 41 to the buffer layer 61' is different because of the stripe ridge. By the auto-doping of p type impurities from the buffer layer 61', the MQW layer 4b except directly below the stripe ridge is disordered. Therefore, a semiconductor laser device producing high power output can be quite easily produced.

As is evident from the foregoing description, according to the present invention, since a light guide layer is disposed between the first cladding layer and the active layer, the light emission region is shifted toward the light guide layer and is seperated from the current blocking layer. Thus, the light oscillation mode in the neighborhood of the cavity facet is stabilized and a semiconductor laser device having stable optical characteristics is obtained.

According to another aspect of the present invention, a p type GaAs buffer layer which contains p type dopants in a higher concentration than the second cladding layer is disposed between the second cladding layer and the current blocking layer . By the diffusion of dopants from the p type GaAs buffer layer, the MQW layer of the active layer is disordered in the neighborhood of the cavity facet and a facet window structure is produced. Therefore, coincidence of the pn junction surface and the regrowth interface is avoided and a high power output operation is obtained.

According to a further aspect of the present invention, a p type buffer layer which contains p type dopants in a higher concentration than the second cladding layer and an n type current blocking layer are successively epitaxially grown except on the top surface of the stripe ridge which ridge is spaced from the neighborhood of the facets, and a p type contact layer is epitaxially grown on the top surface of the stripe shaped ridge and the n type blocking layer. During these epitaxial growth processes, the MQW layer of the active layer is disordered by the auto-doping from the p type buffer layer except directly below the stripe ria. Accordingly, a semiconductor laser device having a window structure and a current non-injection region and producing a high power output can be quite easily produced.

What is claimed is:

1. A semiconductor laser device including facets through which laser light is emitted comprising:
an n type GaAs substrate;

an n type $Al_xGa_{1-x}As$ first cladding layer disposed on said n type GaAs substrate;

an n type $Al_yGa_{1-y}As$ (x>y) light guide layer disposed on said first cladding layer;

an $Al_zGa_{1-z}As$ (y>z) active layer disposed on said light guide layer;

a p type $Al_xGa_{1-x}As$ second cladding layer disposed on said active layer and including a stripe ridge except in the neighborhood of at least one of the factes, said stripe ridge having a top surface opposite the substrate;

an n type GaAs current blocking layer disposed on said second cladding layer, but not on the top surface, burying the ridge; and a p type GaAs contact layer disposed on said current blocking layer and the top surface of said ridge.

2. A semiconductor laser device including facets through which laser light is emitted comprising:

an n type GaAs substrate;

an n type $Al_xGa_{1-x}As$ first cladding layer disposed on said n type GaAs substrate;

an n type $Al_yGa_{1-y}As$ (x>y) light guide layer disposed on said first cladding layer;

an $Al_pGa_{1-p}As$-$Al_qGa_{1-q}As$ (y>q>p) multi quantum well active layer disposed on said light guide layer;

a p type $Al_zGa_{1-z}As$ (z>q) second cladding layer disposed on said active layer and including a stripe ridge except in the neighborhood of at least one of the facets, said stripe ridge having a top surface opposite the substrate;

a p type GaAs buffer layer containing p type dopants in a higher concentration than said second cladding layer disposed on said second cladding layer but not on said ridge;

an n type GaAs current blocking layer disposed on said buffer layer and said second cladding layer, but not on the top surface, burying said ridge; and a p type GaAs contact layer disposed on said current blocking layer and on the top surface of said ridge wherein said multi quantum well layer is disordered except directly opposite said ridge by p type dopants that have diffused from said p type GaAs buffer layer.

3. The semiconductor laser of claim 1 wherein said light guide layer has an index of refraction intermediate the indices of refraction of said active layer and said second cladding layer.

4. The semiconductor laser of claim 2 wherein said light guide layer has an index of refraction intermediate the indices of refraction of said active layer and said second cladding layer.

5. The semiconductor laser of claim 2 including a p type GaAs cap layer disposed between said second cladding layer and said contact layer in said ridge.

6. A semiconductor laser device including facets through which laser light is emitted comprising:

an n type GaAs substrate;

an n type $Al_xGa_{1-x}As$ first cladding layer disposed on said n type GaAs substrate;

an n type $Al_yGa_{1-y}As$ (x>y) light guide layer disposed on said first cladding layer;

an $Al_pGa_{1-p}As$-$Al_qGa_{1-q}As$ (y>q>p) multi quantum well active layer disposed on said light guide layer;

a p type $Al_xGa_{1-x}As$ second cladding layer disposed on said active layer and including a stripe ridge except in the neighborhood of at least one of the facets, said stripe ridge having a top surface opposite the substrate;

an n type GaAs current blocking layer disposed on said second cladding layer, but not on the top surface, burying the ridge; and a p type GaAs contact layer disposed on said current blocking layer and the top surface of said ridge.

7. The semiconductor laser of claim 6 wherein said light guide layer has an index of refraction intermediate the indices of refraction of said active layer and said second cladding layer.

8. A semiconductor laser device including facets through which laser light is emitted comprising:

an n type GaAs substrate;

an n type $Al_xGa_{1-x}As$ first cladding layer disposed on said n type GaAs substrate;

an n type $Al_yGa_{1-y}As$ (x>y) light guide layer disposed on said first cladding layer;

an $Al_pGa_{1-p}As$-$Al_qGa_{1-q}As$ (y>q>z) multi quantum well active layer disposed on said light guide layer;

a p type $Al_xGa_{1-x}As$ second cladding layer disposed on said active layer and including a stripe ridge except in the neighborhood of at least one of the, said stripe ridge having a top surface opposite the substrate;

a p type GaAs buffer layer disposed on said second cladding layer but not on said ridge;

an n type GaAs current blocking layer disposed on said buffer layer and said second cladding layer, but not on the top surface, burying the ridge; and a p type GaAs contact layer disposed on said current blocking layer and the top surface of said ridge.

9. The semiconductor laser of claim 8 wherein said light guide layer has an index of refraction intermediate the indices of refraction of said active layer and said second cladding layer.

* * * * *